United States Patent
Kang

(10) Patent No.: US 12,342,722 B2
(45) Date of Patent: Jun. 24, 2025

(54) THERMOELECTRIC ELEMENT

(71) Applicant: LG INNOTEK CO., LTD., Seoul (KR)

(72) Inventor: In Seok Kang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/256,767

(22) PCT Filed: Nov. 30, 2021

(86) PCT No.: PCT/KR2021/017824
§ 371 (c)(1),
(2) Date: Jun. 9, 2023

(87) PCT Pub. No.: WO2022/124674
PCT Pub. Date: Jun. 16, 2022

(65) Prior Publication Data
US 2024/0099140 A1    Mar. 21, 2024

(30) Foreign Application Priority Data

Dec. 10, 2020   (KR) ........................ 10-2020-0171884

(51) Int. Cl.
*H10N 10/817* (2023.01)
*H10N 10/17* (2023.01)

(52) U.S. Cl.
CPC ........... *H10N 10/817* (2023.02); *H10N 10/17* (2023.02)

(58) Field of Classification Search
CPC ...... H10N 10/817; H10N 10/17; H10N 10/01; H10N 10/81; H10N 10/85
See application file for complete search history.

(56) References Cited

U.S. PATENT DOCUMENTS

| 2015/0179912 A1* | 6/2015 | Maeshima | H10N 10/17 136/211 |
| 2016/0141479 A1* | 5/2016 | Matsunami | H10N 10/17 136/238 |

FOREIGN PATENT DOCUMENTS

| JP | 2019-62054 A | 4/2019 |
| KR | 10-2013-0007201 A | 1/2013 |
| KR | 10-1773869 B1 | 9/2017 |
| KR | 20200071488 A * | 6/2020 |
| WO | 2009/001598 A1 | 12/2008 |
| WO | 2014/199541 A1 | 12/2014 |

OTHER PUBLICATIONS

English machine translation of KR20200071488 A (Year: 2024).*
International Search Report dated Mar. 8, 2022 in International Application No. PCT/KR2021/017824.

* cited by examiner

*Primary Examiner* — Angelo Trivisonno
(74) *Attorney, Agent, or Firm* — Saliwanchik, Lloyd & Eisenschenk

(57) ABSTRACT

According to an embodiment, disclosed is a thermoelectric element comprising: an electrode; a semiconductor structure arranged on the electrode; a diffusion barrier layer arranged on the bottom surface of the semiconductor structure, and having an opening part; a metal layer arranged on the bottom surface of the diffusion barrier layer; and a conductive bonding layer arranged between the metal layer and the electrode, wherein a part of the metal layer extends to the inside of the opening part of the diffusion barrier layer so as to be electrically connected to the semiconductor structure.

7 Claims, 13 Drawing Sheets

THERMOELECTRIC ELEMENT

CROSS-REFERENCE TO RELATED APPLICATIONS

This application is the U.S. national stage application of International Patent Application No. PCT/KR2021/017824, filed Nov. 30, 2021, which claims the benefit under 35 U.S.C. § 119 of Korean Application No. 10-2020-0171884, filed Dec. 10, 2020, the disclosures of each of which are incorporated herein by reference in their entirety.

TECHNICAL FIELD

The present invention relates to a thermoelectric element, and more particularly, to a thermoelectric element with improved reliability.

BACKGROUND ART

A thermoelectric phenomenon is a phenomenon occurring due to movement of electrons and holes in a material and means direct energy conversion between heat and electricity.

A thermoelectric element is a generic term for elements using the thermoelectric phenomenon and has a structure in which P-type thermoelectric materials and N-type thermoelectric materials are joined between metal electrodes to form PN junction pairs.

The thermoelectric elements may be classified into elements using a change in electrical resistance according to temperature, elements using the Seebeck effect, which is a phenomenon in which an electromotive force is generated due to a difference in temperature, and elements using the Peltier effect, which is a phenomenon in which heat absorption or heating occurs due to current.

The thermoelectric elements are being variously applied to home appliances, electronic components, communication components, and the like. For example, the thermoelectric elements may be applied to cooling devices, heating devices, power generation devices, and the like. Accordingly, the demand for thermoelectric performance of the thermoelectric elements is gradually increasing.

Meanwhile, there is a problem that a compound is formed between a thermoelectric leg and solder due to the movement of the solder or a conductive bonding layer while the thermoelectric element performs power generation using a temperature difference, resulting in a decrease in thermoelectric performance and a decrease in reliability of the thermoelectric element.

DISCLOSURE

Technical Problem

The technical objective to be achieved by the present invention is to provide a thermoelectric element including a diffusion barrier layer configured to suppress a phenomenon in which a conductive bonding layer moves to a leg (or a semiconductor structure) in the thermoelectric element.

The present invention is also directed to providing a thermoelectric element capable of effectively suppressing the movement of a conductive bonding layer and having improved reliability by bringing a sealing member into contact with a diffusion barrier layer.

The present invention is also directed to providing a thermoelectric element having improved power generation performance by suppressing the movement of a conductive bonding layer.

In particular, the technical objective to be achieved by the present invention is to provide a thermoelectric module or a power generation device whose reliability is not reduced by disposing a plurality of sealing members at different locations in the thermoelectric module.

Objectives to be solved by the embodiment are not limited to the above-described objective and will include objectives and effectiveness which may be identified by solutions for the objectives and the embodiments described below.

Technical Solution

A thermoelectric element according to one embodiment of the present invention includes an electrode, a semiconductor structure disposed on the electrode, a diffusion barrier layer disposed on a bottom surface of the semiconductor structure and having an opening part, a metal layer disposed on a bottom surface of the diffusion barrier layer, and a conductive bonding layer disposed between the metal layer and the electrode, wherein a part of the metal layer extends into the opening part of the diffusion barrier layer to be electrically connected to the semiconductor structure.

The metal layer may include a first region vertically overlapping the diffusion barrier layer and a second region vertically overlapping the opening part of the diffusion barrier layer.

A thickness of the second region may be greater than a thickness of the first region, and the first region may surround the second region.

The thermoelectric element may further include a sealing member surrounding the electrode, the semiconductor structure, the diffusion barrier layer, and the metal layer.

The thermoelectric element may further include a substrate disposed below the electrode, and an insulating layer disposed between the substrate and the electrode, wherein the sealing member may be in contact with the insulating layer.

The diffusion barrier layer may be provided in plural and includes a first outer side surface disposed at an outermost side, and the sealing member may be in contact with the first outer side surface.

The semiconductor structure may be provided in plural and includes a second outer side surface disposed at an outermost side, and the sealing member may extend from the first outer side surface to the second outer side surface.

The metal layer may be provided in plural and includes a third outer side surface disposed at an outermost side, and the sealing member may extend from the first outer side surface to the third outer side surface.

The diffusion barrier layer may be made of a metal or an insulating material.

The substrate may include a first substrate and a second substrate facing each other, the diffusion barrier layer may include a first diffusion barrier layer disposed between the semiconductor structure and the first substrate and a second diffusion barrier layer disposed between the semiconductor structure and the second substrate, and an opening part of the first diffusion barrier layer may vertically overlap an opening part of the second diffusion barrier layer.

A top surface of the metal layer may be flatter than a bottom surface of the metal layer.

Advantageous Effects

According to the embodiment of the present invention, a thermoelectric element can be implemented, which can suppress a phenomenon in which a conductive bonding layer moves to a leg (or a semiconductor structure) in the thermoelectric element.

In addition, according to the embodiment of the present invention, a thermoelectric module with improved reliability can be implemented.

In particular, according to the embodiment of the present invention, a thermoelectric element having improved power generation performance can be implemented.

In addition, a thermoelectric element or a thermoelectric module according to the embodiment of the present invention can be applied not only to an application implemented in a small size but also to an application implemented in a large size such as a waste heat pipe, such as a heat transfer pipe, a rainwater pipe, and an oil pipe, a vehicle, a ship, a steel mill, an incinerator, or the like.

Various advantages and effects of the present invention are not limited to the above description and can be more easily understood through the description of specific exemplary embodiments of the present invention.

MODES OF THE INVENTION

Hereinafter, exemplary embodiments of the present invention will be described in detail with reference to the accompanying drawings.

However, the technical spirit of the present invention is not limited to some embodiments which will be described and may be embodied in various forms, and one or more elements in the embodiments may be selectively combined and replaced to be used within the scope of the technical spirit of the present invention.

Further, the terms used in the embodiments of the present invention (including technical and scientific terms), may be interpreted with meanings that are generally understood by those skilled in the art unless particularly defined and described, and terms which are generally used, such as terms defined in a dictionary, may be understood in consideration of their contextual meanings in the related art.

Further, the terms used in the embodiments of the present invention are provided only to describe embodiments of the present invention and not for purposes of limitation.

In the present specification, unless clearly indicated otherwise by the context, singular forms include the plural forms thereof, and in a case in which "at least one (or one or more) among A, B, and C" is described, this may include at least one combination among all combinations which can be combined with A, B, and C.

Further, terms such as first, second, A, B, (a), (b), and the like may be used to describe elements of the embodiments of the present invention.

These terms are only provided to distinguish the elements from other elements, and the essence, sequence, order, or the like of the elements are not limited by the terms.

In addition, when an element is described as being "connected," "coupled," or "linked" to another element, the element may include not only a case of being directly connected, coupled, or linked to another element but also a case of being connected, coupled, or linked to another element by still another element between the element and another element.

Further, when an element is described as being formed "on (above)" or "under (below)" another element, the term "on (above)" or "under (below)" includes both of a case in which two elements are in direct contact with each other or a case in which one or more elements are (indirect contact) disposed between two elements. In addition, when an element is described as being disposed "on or under" another element, such a description may include a case in which the element is disposed at an upper side or a lower side with respect to another element.

Figure 1:
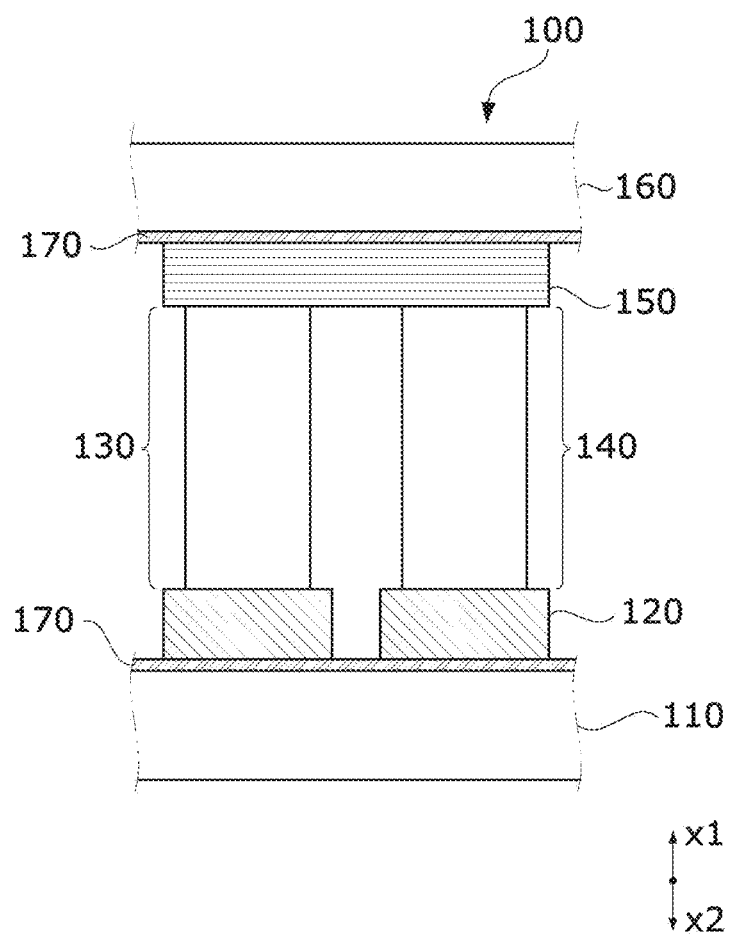
FIG. 1 is a cross-sectional view of a thermoelectric element.
Figure 2:
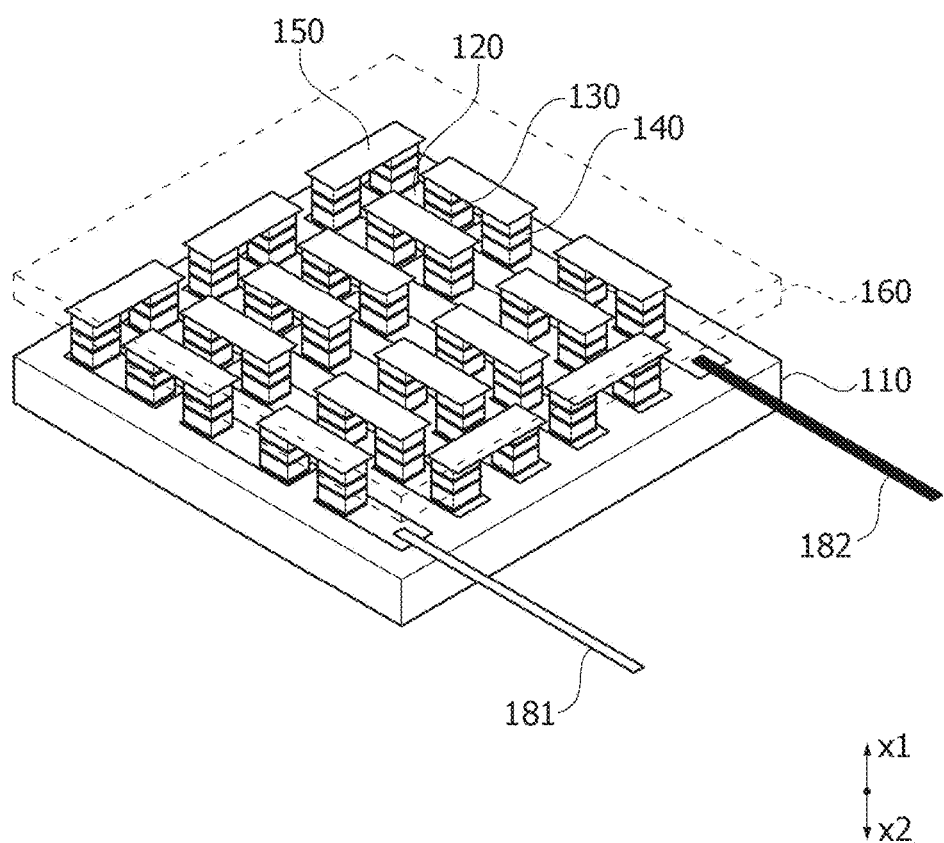
FIG. 2 is a perspective view of the thermoelectric element.
Figure 3:
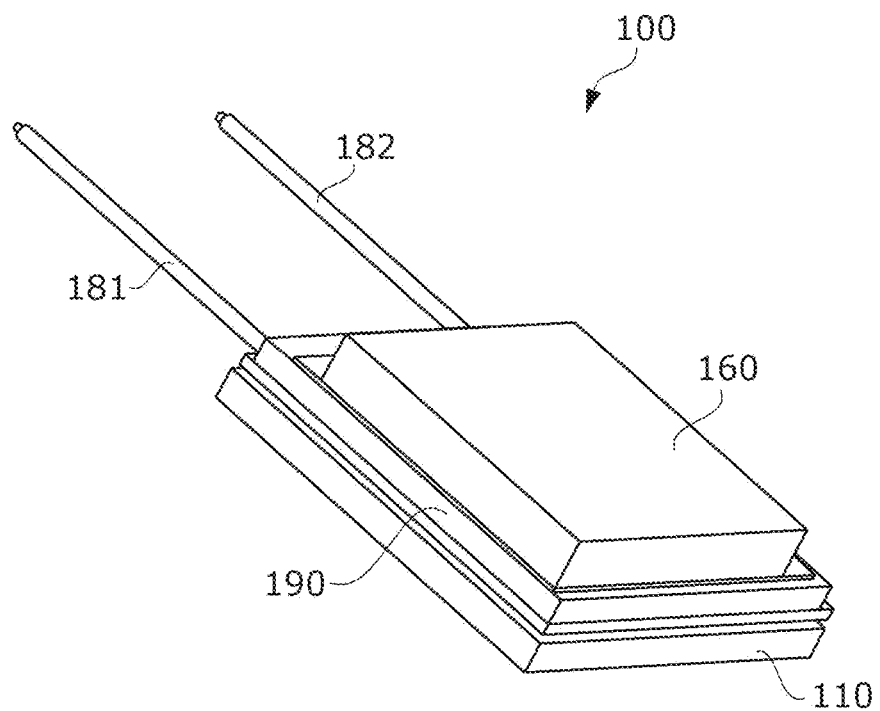
FIG. 3 is a perspective view of the thermoelectric element including a sealing member.
Figure 4:
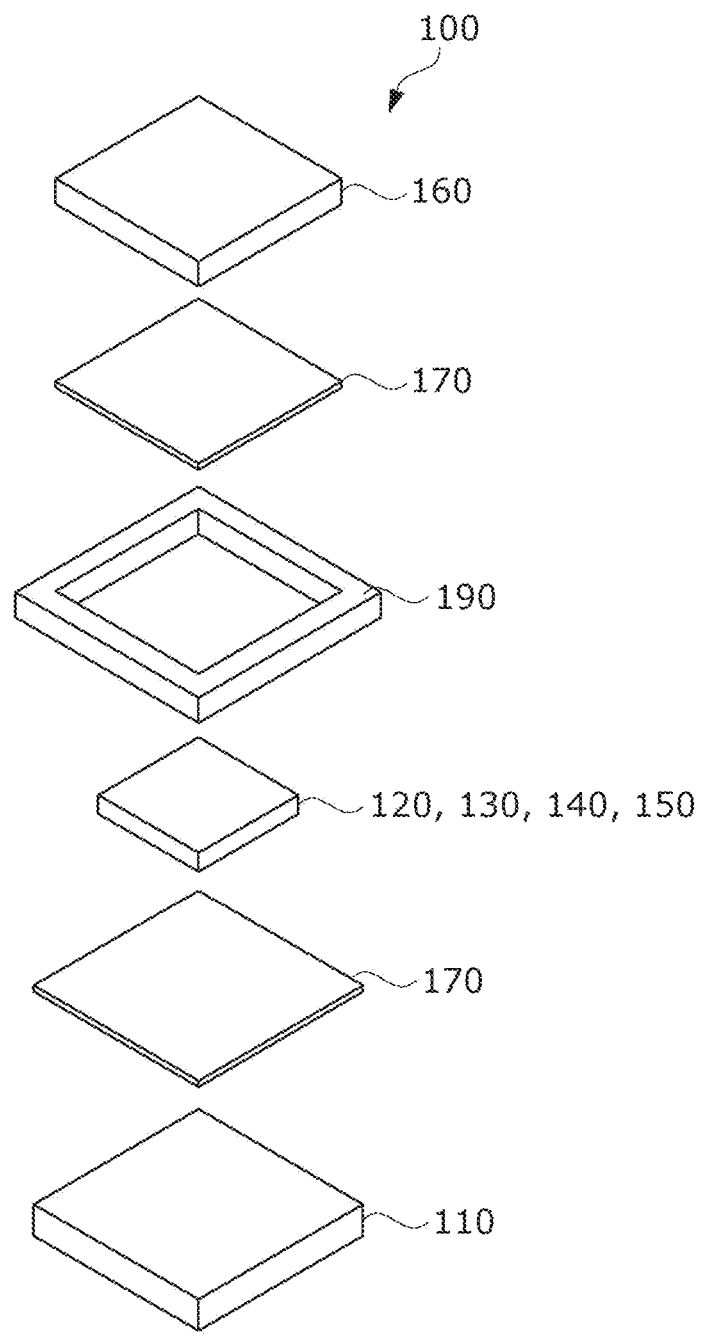
FIG. 4 is an exploded perspective view of the thermoelectric element including the sealing member.

FIG. 1 is a cross-sectional view of a thermoelectric element, and FIG. 2 is a perspective view of the thermoelectric element. FIG. 3 is a perspective view of the thermoelectric element including a sealing member, and FIG. 4 is an exploded perspective view of the thermoelectric element including the sealing member.

Referring to FIGS. 1 and 2, a thermoelectric element 100 includes a lower substrate 110, lower electrodes 120, P-type thermoelectric legs 130, N-type thermoelectric legs 140, upper electrodes 150, and an upper substrate 160.

The lower electrodes 120 are disposed between the lower substrate 110 and lower bottom surfaces of the P-type thermoelectric legs 130 and the N-type thermoelectric legs 140, and the upper electrodes 150 are disposed between the upper substrate 160 and top surfaces of the P-type thermoelectric legs 130 and the N-type thermoelectric legs 140. Accordingly, a plurality of P-type thermoelectric legs 130 and a plurality of N-type thermoelectric legs 140 are electrically connected by the lower electrodes 120 and the upper electrodes 150. A pair of the P-type thermoelectric leg 130 and the N-type thermoelectric leg 140, which are disposed between the lower electrodes 120 and the upper electrode 150 and electrically connected to each other, may form a unit cell.

For example, when a voltage is applied between the lower electrode 120 and the upper electrode 150 through lead lines 181 and 182, due to the Peltier effect, the substrate through which a current flows from the P-type thermoelectric leg 130 to the N-type thermoelectric leg 140 may absorb heat and thus serve as a cooling unit, and the substrate through which a current flows from the N-type thermoelectric leg 140 to the P-type thermoelectric leg 130 may be heated and thus serve as a heating unit. Alternatively, when a temperature difference is provided between the lower electrode 120 and the upper electrode 150, due to the Seebeck effect, charges in the P-type thermoelectric leg 130 and the N-type thermoelectric leg 140 move, and thus electricity may be produced.

Although the lead lines 181 and 182 are illustrated as being disposed on the lower substrate 110 in FIGS. 1 to 4, the present invention is not limited thereto, and the lead lines 181 and 182 may be disposed on the upper substrate 160, or one of the lead lines 181 and 182 may be disposed on the lower substrate 110 and the other may be disposed on the upper substrate 160.

Here, the P-type thermoelectric leg 130 and the N-type thermoelectric leg 140 may be bismuth-telluride (Bi—Te)-based thermoelectric legs including bismuth (Bi) and tellurium (Te) as main raw materials. The P-type thermoelectric leg 130 may be a Bi—Te-based thermoelectric leg including at least one among antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may include a Bi—Sb-Te-based main raw material in an amount of 99 to 99.999 wt % and a material containing at least one among nickel (Ni), aluminum (Al), copper (Cu), silver (Ag), lead (Pb), boron (B), gallium (Ga), and indium (In) in an amount of 0.001 to 1 wt % based on the total weight of 100 wt %. The N-type thermoelectric leg 140 may be a Bi—Te-based thermoelectric leg including at least one among selenium (Se), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may include a Bi—Se-Te-based main raw material in an amount of 99 to 99.999 wt % and a material containing at least one among nickel (Ni), aluminum (Al), copper (Cu), silver (Ag), lead (Pb), boron (B), gallium (Ga), and indium (In) in an amount of 0.001 to 1 wt % based on the total weight of 100 wt %. Accordingly, in the present specification, the thermoelectric leg may be referred to as a semiconductor structure, a semiconductor device, a semiconductor substance layer, a semiconductor material layer, a conductive semiconductor structure, a thermoelectric structure, a thermoelectric substance layer, a thermoelectric material layer, or the like.

The P-type thermoelectric leg 130 and the N-type thermoelectric leg 140 may be formed in a bulk type or a stacked type. In general, the bulk type P-type thermoelectric leg 130 or the bulk type N-type thermoelectric leg 140 may be obtained through a process of performing a thermal process on a thermoelectric material to manufacture an ingot, pulverizing and sieving the ingot to obtain powder for a thermoelectric leg, sintering the powder, and cutting a sintered body. Here, the P-type thermoelectric leg 130 and the N-type thermoelectric leg 140 may be polycrystalline thermoelectric legs. When the P-type thermoelectric leg 130 and the N-type thermoelectric leg 140 are polycrystalline thermoelectric legs as described above, the strength of each of the P-type thermoelectric leg 130 and the N-type thermoelectric leg 140 may be increased. The stacked type P-type thermoelectric leg 130 or the stacked type N-type thermoelectric leg 140 may be obtained through a process of coating a sheet-shaped base with a paste including a thermoelectric material to form unit members, stacking the unit members, and cutting the stacked unit members.

Here, the pair of P-type thermoelectric leg 130 and N-type thermoelectric leg 140 may have the same shape and volume or may have different shapes and volumes. For example, since electrical conduction properties of the P-type thermoelectric leg 130 and the N-type thermoelectric leg 140 are different, a height or sectional area of the N-type thermoelectric leg 140 may be formed to be different from that of the P-type thermoelectric leg 130.

Here, the P-type thermoelectric leg 130 or the N-type thermoelectric leg 140 may have a cylindrical shape, a polygonal columnar shape, an elliptical columnar shape, or the like.

Alternatively, the P-type thermoelectric leg 130 or the N-type thermoelectric leg 140 may have a stacked type structure. For example, the P-type thermoelectric leg or the N-type thermoelectric leg may be formed by a method of stacking a plurality of structures each having a sheet-shaped base coated with a semiconductor material and then cutting the plurality of structures. Thus, it is possible to inhibit the loss of a material and improve electrical conduction properties. Each of the structures may further include a conductive layer having an opening pattern, thereby increasing adhesion between the structures, lowering thermal conductivity, and increasing electrical conductivity.

Alternatively, the P-type thermoelectric leg 130 or the N-type thermoelectric leg 140 may be formed such that sectional areas thereof are different within one thermoelectric leg. For example, in one thermoelectric leg, sectional areas of both end portions each disposed to face the electrode may be formed to be greater than a sectional area between the both end portions. Accordingly, a great temperature difference may be formed between the both end portions, and thus thermoelectric efficiency may be increased.

Performance of the thermoelectric element according to one embodiment of the present invention may be represented by a figure of merit ZT. The thermoelectric figure-of-merit (ZT) may be expressed by Equation 1, $$ZT = \alpha^2 \cdot \sigma \cdot T / k \qquad \text{[Equation 1]}$$

where $\alpha$ denotes the Seebeck coefficient [V/K], $\sigma$ denotes electrical conductivity [S/m], and $\alpha^2\sigma$ denotes a power factor [W/mK$^2$]. In addition, T denotes temperature, and k denotes thermal conductivity [W/mK]. k may be expressed as $a \cdot c_p \cdot \rho$, wherein a denotes thermal diffusivity [cm$^2$/S], $c_p$ denotes specific heat [J/gK], and $\rho$ denotes density [g/cm$^3$].

In order to obtain the thermoelectric figure-of-merit of the thermoelectric element, a Z value [V/K] is measured using a Z meter, and the thermoelectric figure-of-merit (ZT) may be calculated using the measured Z value.

Here, each of the lower electrodes 120, which are disposed between the lower substrate 110 and the P-type thermoelectric leg 130 and the N-type thermoelectric leg 140, and the upper electrode 150, which is disposed between the upper substrate 160 and the P-type thermoelectric leg 130 and the N-type thermoelectric leg 140, may include at least one among copper (Cu), silver (Ag), aluminum (Al), and nickel (Ni), and have a thickness of 0.01 mm to 0.3 mm. When the thickness of the lower electrode 120 or the upper electrode 150 is less than 0.01 mm, the function as an electrode of the lower electrode 120 or the upper electrode 150 may be deteriorated and thus electrical conduction performance may be lowered, and when the thickness of the lower electrode 120 or the upper electrode 150 is greater than 0.3 mm, thermal conduction efficiency transferred to the thermoelectric leg 140 may be lowered due to an increase in thermal resistance.

In addition, the lower substrate 110 and the upper substrate 160 opposite to each other may be metal substrates, and a thickness of each of the metal substrates may range from 0.1 mm to 1.5 mm. When the thickness of the metal substrate is less than 0.1 mm or greater than 1.5 mm, heat radiation characteristics or thermal conductivity may be excessively high, and thus the reliability of the thermoelectric element may be lowered. In addition, when the lower substrate 110 and the upper substrate 160 are metal substrates, insulating layers 170 may be further formed between the lower substrate 110 and the lower electrodes 120 and between the upper substrate 160 and the upper electrodes 150. Each of the insulating layers 170 may include a material having a thermal conductivity of 1 to 20 W/mK.

In this case, the lower substrate 110 and the upper substrate 160 may be formed to have different sizes. For example, a volume, thickness, or area of one of the lower substrate 110 and the upper substrate 160 may be formed to be greater than that of the other. Accordingly, it is possible to increase the heat absorption performance or heat dissipation performance of the thermoelectric element. For example, at least one of a volume, a thickness, and an area of a substrate disposed in a high temperature region for the Seebeck effect, applied as a heating region for the Peltier effect, or on which a sealing member for protecting the thermoelectric module from the external environment is disposed, may be greater than at least one of a volume, a thickness, and an area of the other substrate.

In addition, a heat dissipation pattern, for example, a concavo-convex pattern, may be formed on a surface of at least one of the lower substrate 110 and the upper substrate 160. Accordingly, the heat dissipation performance of the thermoelectric element may be increased. In a case in which the concavo-convex pattern is formed on a surface in contact with the P-type thermoelectric leg 130 or the N-type thermoelectric leg 140, a bonding property between the thermoelectric leg and the substrate may also be improved. The thermoelectric element 100 includes the lower substrate 110, the lower electrodes 120, the P-type thermoelectric legs 130, the N-type thermoelectric legs 140, the upper electrodes 150, and the upper substrate 160.

As illustrated in FIGS. 3 and 4, a sealing member 190 may be further disposed between the lower substrate 110 and the upper substrate 160. The sealing member 190 may be disposed on side surfaces of the lower electrode 120, the P-type thermoelectric leg 130, the N-type thermoelectric leg 140, and the upper electrode 150 between the lower substrate 110 and the upper substrate 160. Accordingly, the lower electrode 120, the P-type thermoelectric leg 130, the N-type thermoelectric leg 140, and the upper electrode 150 may be sealed from external moisture, heat, contamination, and the like. Here, the sealing member 190 may be disposed to be spaced a predetermined distance apart from side surfaces of an outermost side of the plurality of lower electrodes 120, an outermost side of the plurality of P-type thermoelectric legs 130 and the plurality of N-type thermoelectric legs 140, and an outermost side of the plurality of upper electrodes 150. The sealing member 190 may be in contact with the lower substrate 110 and the upper substrate 160 or may be in contact with an insulating layer to be described below. For example, the sealing member 190 may be made of a material such as various oxides and may be made of an insulating material. For example, the sealing member 190 may include at least one of an epoxy resin and a silicone resin, or may include a tape having both sides on which at least one of an epoxy resin and a silicone resin is applied.

The sealing member 190 serves to seal the bottom surface of the lower substrate 110 or the top surface of the upper substrate, and may increase a sealing effect of the lower electrode 120, the P-type thermoelectric leg 130, the N-type thermoelectric leg 140, and the upper electrode 150. For example, the sealing member 190 may be interchangeably used with a finishing material, a finishing layer, a waterproof material, a waterproof layer, or the like.

Meanwhile, a guide part for withdrawing the lead wires 181 and 182 connected to the electrode may be formed in the sealing member 190. Furthermore, the sealing member 190 may further include an injection molded product made of plastic or the like, such as a sealing case. The above description of the sealing member is merely exemplary, and the sealing member may be modified in various forms. In addition, although not shown in the drawing, a heat-insulating material may be further included to surround the sealing member. Alternatively, the sealing member may include a heat-insulating component.

Although the terms "lower substrate 110," "lower electrode 120," "upper electrode 150," and "upper substrate 160" are used in the above, they are arbitrarily referred to as "upper portion" and "lower portion" for ease of understanding and convenience of description, and thus it is understood that the positions may be reversed such that the lower substrate 110 and the lower electrode 120 are disposed on the upper side and the upper electrode 150 and the upper substrate 160 may be disposed on the lower side.

In addition, in the present specification, the term "vertical direction" is interchangeably used with "first direction" and the like, and refers to a direction toward the upper substrate 160 from the lower substrate 110 or toward the lower substrate 110 from the upper substrate 160. For example, the first direction may include a 1-1 direction (×1 direction) and a 1-2 direction (×2 direction). In addition, the 1-1 direction (×1 direction) is a direction toward the upper substrate from the lower substrate, and the 1-2 direction (×2 direction) is a direction toward the lower substrate from the upper substrate. In addition, a horizontal direction is a direction perpendicular to the vertical direction. The above description may be applied throughout this specification.

Figure 5:
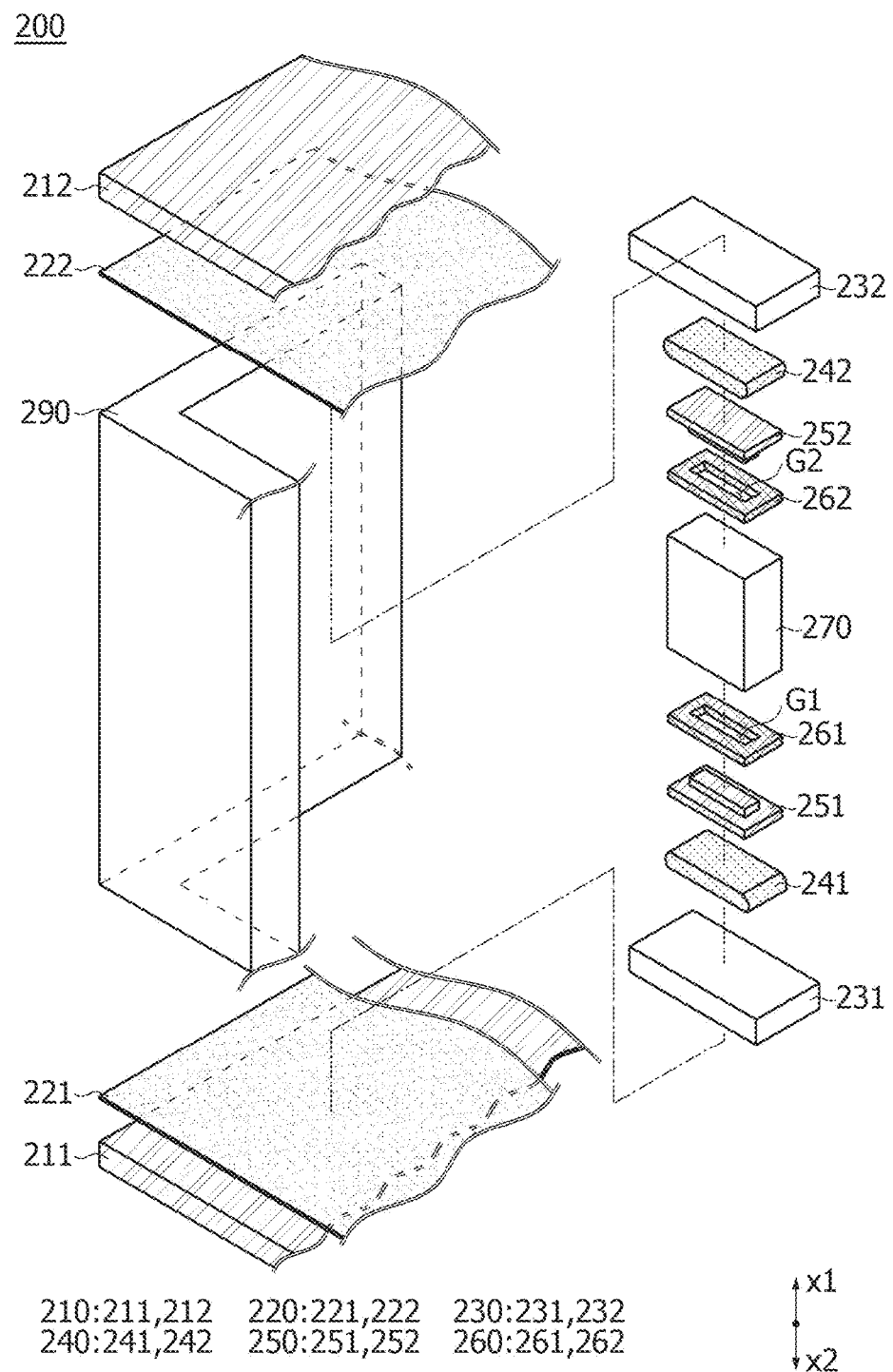
FIG. 5 is an exploded perspective view of a thermoelectric element according to one embodiment of the present invention.
Figure 6:
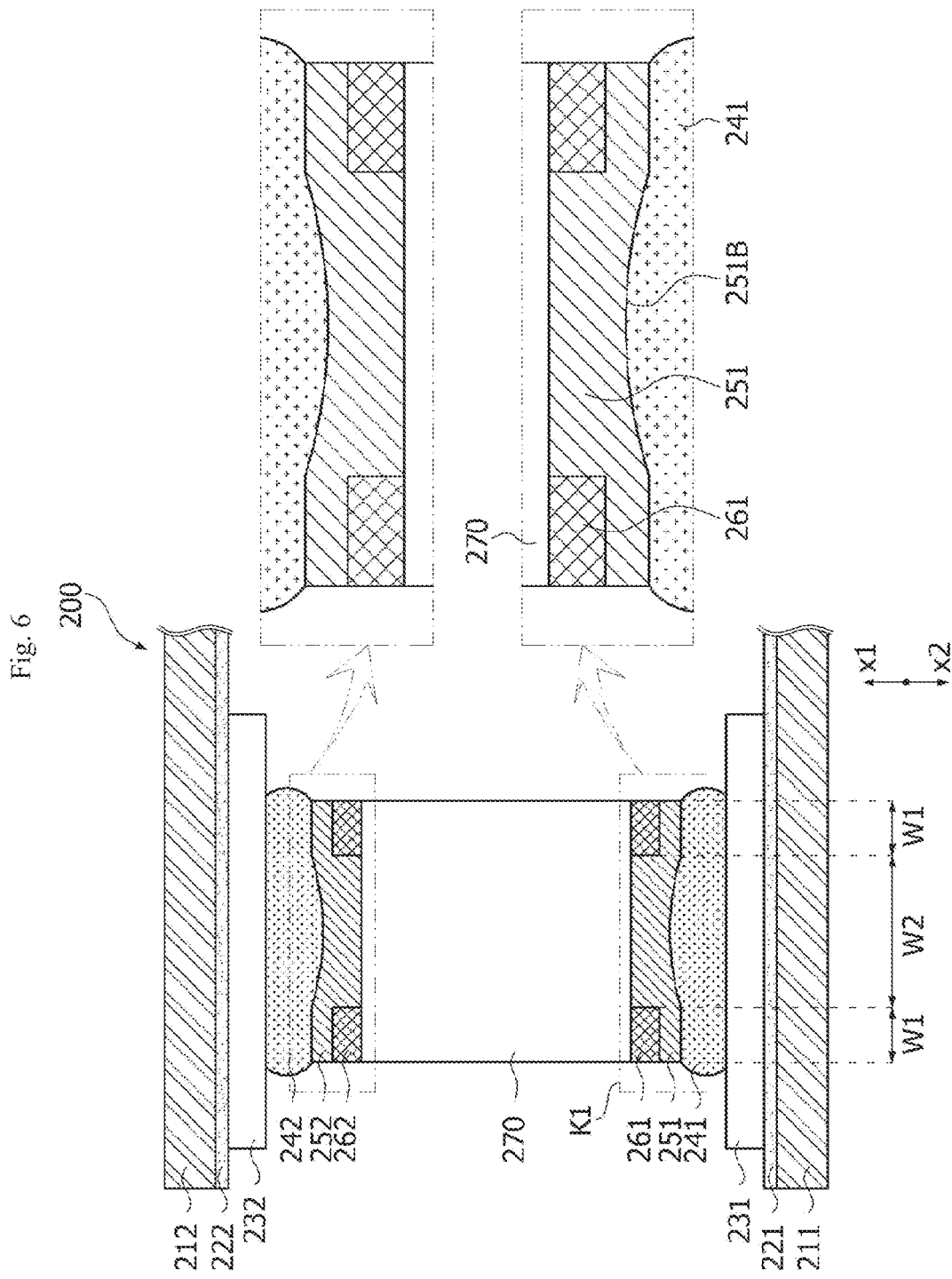
FIG. 6 is a cross-sectional view of the thermoelectric element according to one embodiment of the present invention.
Figure 7:
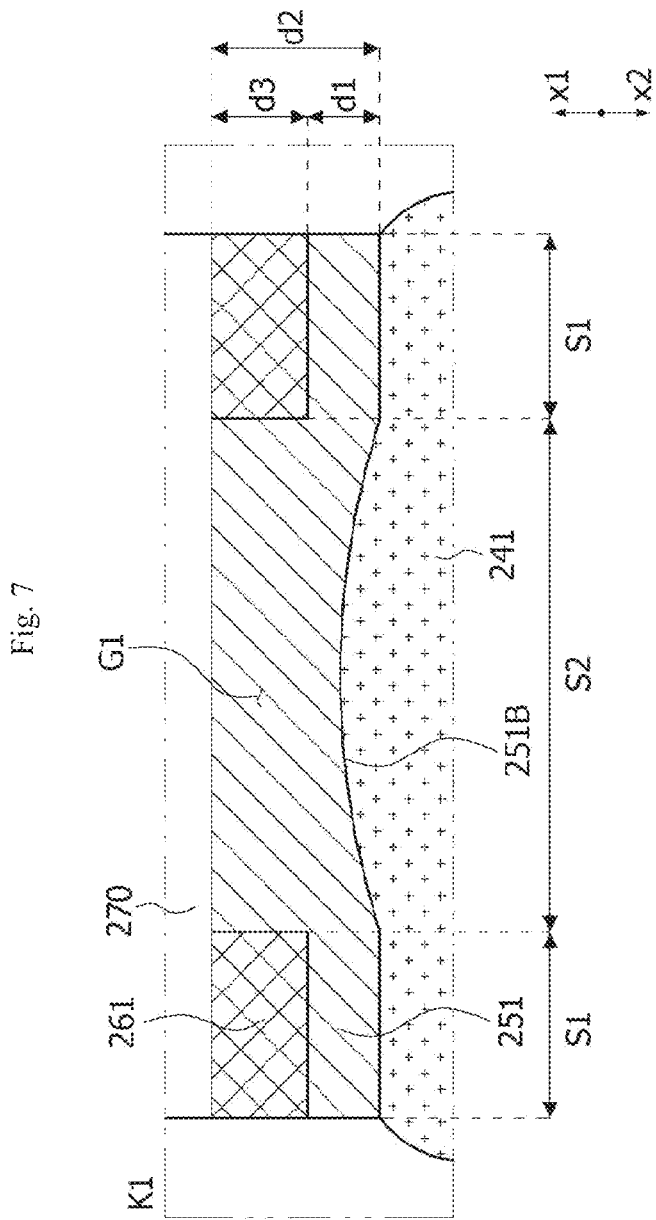
FIG. 7 is an enlarged view of portion K1 in FIG. 6.

FIG. 5 is an exploded perspective view of a thermoelectric element according to one embodiment of the present invention, FIG. 6 is a cross-sectional view of the thermoelectric element according to one embodiment of the present invention, and FIG. 7 is an enlarged view of portion K1 in FIG. 6.

Referring to FIGS. 5 and 6, a thermoelectric element 200 according to one embodiment of the present invention may include a substrate 210, an insulating layer 220 disposed on the substrate 210, an electrode 230 disposed on the insulating layer 220, a semiconductor structure 270 disposed on the electrode 230, a diffusion barrier layer 260 disposed on one surface (e.g., a bottom surface) of the semiconductor structure 270, a metal layer 250 disposed on one surface (e.g., a bottom surface) of the diffusion barrier layer, and a conductive bonding layer 240 disposed between the metal layer 250 and the electrode 230. In the present specification, the substrate 210 may include a first substrate 211 and a second substrate 212 spaced apart from each other in the vertical direction.

In addition, the insulating layer 220 may include a first insulating layer 221 disposed on the first substrate 211 and a second insulating layer 222 disposed below the second substrate 212.

Further, the electrode 230 may include a first electrode 231 disposed on the first insulating layer 221 and a second electrode 232 disposed below the second insulating layer 222.

The conductive bonding layer 240 may include a first conductive bonding layer 241 disposed on the first electrode 231 and a second conductive bonding layer 242 disposed below the second electrode 232.

The metal layer 250 may include a first metal layer 251 disposed on the first conductive bonding layer 241 and a second metal layer 252 disposed below the second conductive bonding layer 242.

The diffusion barrier layer 260 may include a first diffusion barrier layer 261 disposed on the first metal layer 251 and a second diffusion barrier layer 262 disposed on the second metal layer 252.

The semiconductor structure 270 may be disposed between the first diffusion barrier layer 261 and the second diffusion barrier layer 262.

Alternatively, the first insulating layer 221 may be disposed on the first substrate 211, and the first electrode 231 may be disposed on the first insulating layer 221. In addition, the first metal layer 251 may be disposed on the first electrode 231, and the semiconductor structure 270 may be disposed on the first metal layer 251. In addition, the first conductive bonding layer 241 may be disposed between the first electrode 231 and the first metal layer 251. Further, the first diffusion barrier layer 261 may be disposed between the first metal layer 251 and the semiconductor structure 270. For example, the first diffusion barrier layer 261 may be disposed on the bottom surface of the semiconductor structure 270.

Further, the diffusion barrier layer 260 may have an opening part. For example, the first diffusion barrier layer 261 may include a first opening part G1, and the second diffusion barrier layer 262 may include a second opening part G2. In the embodiment, the diffusion barrier layer 260 may be made of a metal or an insulating material. In this case, the diffusion barrier layer 260 may have wettability with the conductive bonding layer 240, which is less than that between the metal layer 250 and the conductive bonding layer 240. In other words, when a part of the conductive bonding layer 240 moves along a side surface, the conductive bonding layer 240 may have a significantly reduced surface tension on an outer side surface of the metal layer 250 than the diffusion barrier layer 260. Accordingly, the conductive bonding layer 240 may be evenly spread on the outer side surface of the metal layer 250, and the surface tension is not significantly reduced on an outer side surface of the diffusion barrier layer 260. Accordingly, the conductive bonding layer 240 may be suppressed from moving upward along the outer side surface of the diffusion barrier layer 260. Furthermore, the metal layer 250 of a lower side and the semiconductor structure 270 of an upper side may be electrically connected to each other through the opening part of the diffusion barrier layer 260.

The second diffusion barrier layer 262 may be disposed on the semiconductor structure 270. In addition, the second metal layer 252 may be disposed on the semiconductor structure 270. The metal layer 250 may be disposed on one surface of the diffusion barrier layer 260 and may extend into the opening part of the diffusion barrier layer 260. Thus, the metal layer 250 may be electrically connected to the semiconductor structure 270. For example, the first metal layer 251 may be disposed on a bottom surface of the first diffusion barrier layer 261, and a part of the first metal layer 251 may extend into the first opening part G1 of the first diffusion barrier layer 261 to be electrically connected to the semiconductor structure 270. The first conductive bonding layer 241 may be disposed between the first metal layer 251 and the first electrode 231.

A heat sink may be further disposed on the first substrate 211 or the second substrate 212. Each of the first insulating layer 221 and the second insulating layer 222 may be formed as a resin layer including at least one of an epoxy resin composition containing an epoxy resin and an inorganic filler and a silicone resin composition containing polydimethylsiloxane (PDMS).

In addition, the first insulating layer 221 and the second insulating layer 222 may be respectively formed through a method of coating the first substrate 211 and the second substrate 212 with a resin composition in an uncured or semi-cured state and then disposing and pressing a plurality of pre-aligned first electrodes 231 and a plurality of pre-aligned second electrodes 232.

In addition, the second diffusion barrier layer 262, the second metal layer 252, the second conductive bonding layer 242, the second electrode 232, the second insulating layer 222, and the second substrate 212 may be sequentially stacked in the first direction (e.g., the 1-1 direction (×1 direction)) on the semiconductor structure 270.

In addition, the description of the lower substrate 110, the insulating layer 170, the lower electrode 120, the thermoelectric legs 130 and 140, the upper electrode 150, the insulating layer 170, and the upper substrate 160 of FIGS. 1 to 4 may be equally applied to the first substrate 211, the first insulating layer 221, the first electrode 231, the semiconductor structure 270, the second electrode 232, the second insulating layer 222, and the second substrate 212, respectively. In addition, the semiconductor structure 270 may be the P-type thermoelectric leg 130 or the N-type thermoelectric leg 140 of FIGS. 1 to 4. The structure between the first electrode 231 and the semiconductor structure 270 will be mainly described for convenience of description, but the same description may be applied to the structure between the semiconductor structure 270 and the second electrode 232. Furthermore, the thermoelectric element 200 may further include a sealing member 290 disposed between the first substrate 211 and the second substrate 212 along an outer side of the substrate 210 (the first substrate or the second substrate). The content of the sealing member 190 described with reference to FIGS. 1 to 4 may be applied to the sealing member 290. Thus, the sealing member 290 may surround the electrode 230, the conductive bonding layer 240, the metal layer 250, the diffusion barrier layer 260, and the semiconductor structure 270. In addition, the sealing member 290 may be in contact with the first insulating layer 221 and the second insulating layer 222 of the thermoelectric element 200. A description thereof will be provided below.

In addition, when thermal expansion coefficients of the first substrate 211 and the first insulating layer 221 are different from each other, delamination between the first substrate 211 and the first insulating layer 221 may occur due to a temperature difference between a high-temperature part and a low-temperature part, and when the sealing member 290 is in contact with the first insulating layer 221 or the second insulating layer 222, the sealing member 290 may inhibit external moisture or foreign substances from penetrating into the semiconductor structure 270 through the delamination between the first substrate 211 and the first insulating layer 221. Furthermore, even when warpage occurs between the first substrate 211 and the second substrate 212 due to a difference in thermal expansion coefficient, reliability deterioration of the thermoelectric element due to the warpage may be alleviated by the sealing member 290.

In addition, each of the first insulating layer 221 and the second insulating layer 222 may be formed of a plurality of sub-insulating layers. Hereinafter, a description will be given based on the first insulating layer. For example, although not illustrated in the drawing, the first insulating layer 221 may include a first sub-insulating layer and a second sub-insulating layer having different compositions from each other, the first sub-insulating layer may be disposed on the first substrate 211, and the second sub-insulating layer may be disposed between the first sub-insulating layer and the first electrode 231. For example, the first sub-insulating layer may include a composite including silicon and aluminum. Here, the composite may be at least one among an oxide, a carbide, and a nitride containing silicon and aluminum. For example, the composite may include at least one among an Al—Si bond, an Al—O—Si bond, a Si—O bond, an Al—Si—O bond, and an Al—O bond. The composite including at least one among the Al—Si bond, the Al—O—Si bond, the Si—O bond, the Al—Si—O bond, and the Al—O bond as described above has excellent insulating performance and thus may achieve high withstand voltage performance.

Meanwhile, the second sub-insulating layer may be formed as a resin layer including at least one of an epoxy resin composition containing an epoxy resin and an inorganic filler and a silicone resin composition containing polydimethylsiloxane (PDMS). Accordingly, the second sub-insulating layer may improve an insulation property, a bonding force, and thermal conduction performance between the first sub-insulating layer and the first electrode 231.

In addition, according to the embodiment of the present invention, the first electrode 231 and the semiconductor structure 270 may be bonded by the first conductive bonding layer 241. The first conductive bonding layer 241 may include, for example, at least one of tin (Sn), antimony (Sb), and compounds thereof, but is not limited thereto, and may also include at least one of bismuth (Bi), silver (Ag), copper (Cu), lead (Pb), and compounds thereof, and may be referred to as a solder layer. A thickness of the first conductive bonding layer 241 may be in a range of 30 μm to 120 μm and preferably 40 μm to 110 μm. When the thickness of the first conductive bonding layer 241 satisfies the above numerical range, the first electrode 231 and the semiconductor structure 270 may be stably bonded.

Meanwhile, the first metal layer 251 may be disposed between the first conductive bonding layer 241 and the semiconductor structure 270. The first metal layer 251 may include at least one among nickel (Ni), tin (Sn), palladium (Pd), and molybdenum (Mo). The first metal layer 251 inhibits diffusion of a semiconductor material, for example, Bi or Te, in the semiconductor structure 270 in a direction toward the first electrode 231, and thus, may inhibit performance degradation of the thermoelectric element and enhance a bonding strength between the first electrode 231 and the semiconductor structure 270 due to excellent wettability with the first conductive bonding layer 241.

The first metal layer 251 may be plated, e.g., electrolessly plated, on one surface of the semiconductor structure 270, and thus, may be referred to as a plated layer. Here, the total thickness of the first metal layer 251 may be in a range of 10 μm to 80 μm, preferably 20 μm to 60 μm, and more preferably 25 μm to 40 μm.

The first metal layer 251 may include a plurality of sub-metal layers. For example, the first metal layer 251 may include a first sub-metal layer in contact with the bottom surface of the semiconductor structure 270 and a second sub-metal layer in contact with a bottom surface of the first sub-metal layer. The first sub-metal layer includes nickel (Ni) to inhibit diffusion of the semiconductor material, for example, Bi or Te, in the semiconductor structure 270. In addition, the second sub-metal layer may include titanium (Ti) and tin (Sn) and may be bonded to the conductive bonding layer 240. Accordingly, the first metal layer 251 may perform diffusion barrier performance and bonding performance.

The first diffusion barrier layer 261 may be disposed on the first metal layer 251 and may have the first opening part G1. A part of the first metal layer 251 may extend to the first opening part G1 to be in contact with the semiconductor structure 270. Thus, the first metal layer 251 may be electrically connected to the semiconductor structure 270. In other words, the diffusion barrier layer 261 may be disposed between the first metal layer 251 and the semiconductor structure 270 along an edge of the semiconductor structure 270. That is, the first diffusion barrier layer 261 may be located on the bottom surface of the semiconductor structure 270 and on an outer side the first metal layer 251. The first diffusion barrier layer 261 may be made of a metal or an insulating material. For example, the first diffusion barrier layer 261 may be made of oxide. In addition, the first diffusion barrier layer 261 may have low wettability with the first conductive bonding layer 241. For example, the first diffusion barrier layer 261 may have a lower wettability with the first conductive bonding layer 241 than the first metal layer 251. In this case, the first conductive bonding layer 241 may move to the semiconductor structure 270 along an outer side surface of the first metal layer 251 as the thermoelectric element performs power generation using a temperature difference. In the embodiment, a phenomenon in which the first conductive bonding layer 241 moves along the outer side surface of the first metal layer 251 may be suppressed by disposing the first diffusion barrier layer 261 between the first metal layer 251 and the semiconductor structure 270. Accordingly, a phenomenon in which power generation performance of the thermoelectric element 200 according to the embodiment is degraded may be inhibited. In addition, a phenomenon in which a void is formed in the first conductive bonding layer 241 as the first conductive bonding layer 241 moves to the semiconductor structure 270 may be suppressed. Accordingly, structural reliability of the thermoelectric element 200 may be improved.

Referring to FIGS. 6 and 7, the metal layer 250 according to the embodiment may include a first region S1 overlapping the diffusion barrier layer 260 in the vertical direction and a second region S2 overlapping the opening parts G1 and G2 of the diffusion barrier layer 260 in the vertical direction.

For example, the first metal layer 251 may include the first region S1 overlapping the first diffusion barrier layer 261 in the vertical direction and the second region S2 overlapping the first opening part G1 of the first diffusion barrier layer 261 in the vertical direction. Thus, the first region S1 may overlap the second region S2 in the horizontal direction. In addition, a part of the second region S2 may overlap the first region S1 in the horizontal direction. The horizontal direction may be a direction perpendicular to the vertical direction. In addition, the first region S1 may be disposed to surround the second region S2.

Further, in the embodiment, a width of the first region S1 and a width of the second region S2 may be selective. For example, when the resistance between the first metal layer 251 and the semiconductor structure 270 due to the electrical connection thereof is large, a width W2 of the second region S2 may be greater than a width W1 of the first region S1. In addition, when the resistance between the first metal layer 251 and the semiconductor structure 270 due to the electrical connection thereof is small, the width W2 of the second region S2 may be less than the width W1 of the first region S1. In this case, the width W1 of the first region S1 may be the shortest distance between the opening part (e.g., the first opening part G1) and the outer side surface of the first metal layer 251 in the horizontal direction. In addition, the width W2 of the second region S2 may be the shortest distance between the center (e.g., center of gravity) of the second region S2 and an outer side surface of the second region S2 (or the opening part).

In addition, a thickness d2 of the second region S2 may be greater than a thickness d1 of the first region S1. Thus, step coverage for the bottom surface of the semiconductor structure 270 may be improved. For example, due to the difference in thickness between the second region S1 and the first region S1, the topology of the first diffusion barrier layer 261 in the first region S1 may be alleviated.

For example, a bottom surface of the first metal layer 251 may be convex in a direction toward the semiconductor structure 270 in the second region S2. Alternatively, the bottom surface of the first metal layer 2501 may be convex toward the first opening part G1 in the second region S2. In this case, the first conductive bonding layer 241 may be in contact with the bottom surface of the first metal layer 251 at a lower part of the first metal layer 251. Accordingly, a top surface of the first conductive bonding layer 241 may be convex (241B) toward the first opening part G1 or the semiconductor structure 270 in a region vertically overlapping the second region S2. The description thereof may be equally applied to the second metal layer 252 and the second conductive bonding layer 242. For example, a top surface of the second metal layer 252 may be convex toward the second opening part G2 or the semiconductor structure 270 in the second region S2. Furthermore, the second conductive bonding layer 242 may also be convex toward the second opening part G2 or the semiconductor structure 270 in a region vertically overlapping the second region S2.

Accordingly, in the embodiment, a top surface of the first metal layer may be flatter than the bottom surface of the first metal layer. With this configuration, the bonding strength between the metal layer and the conductive bonding layer is improved, and at the same time, the conductive bonding layer may be suppressed from moving to the semiconductor structure as described above.

Figure 8:
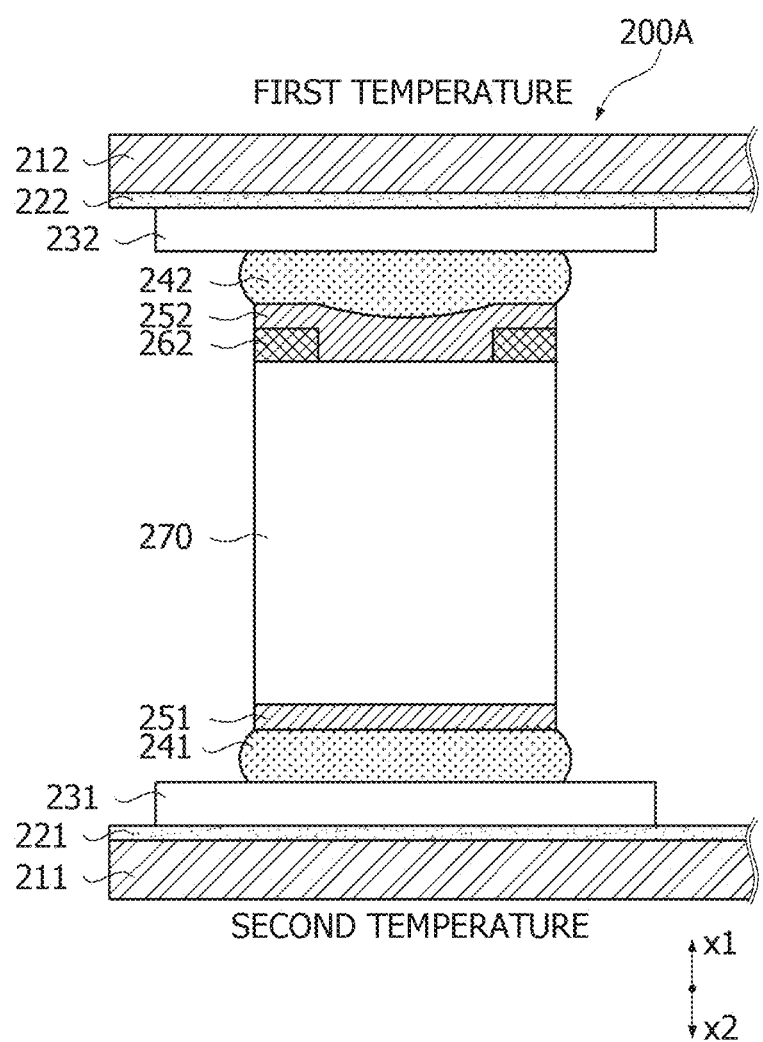
FIG. 8 is a cross-sectional view of a thermoelectric element according to another embodiment of the present invention.

FIG. 8 is a cross-sectional view of a thermoelectric element according to another embodiment of the present invention.

Referring to FIG. 8, a thermoelectric element 200A according to another embodiment may include a substrate 210, an insulating layer 220 disposed on the substrate 210, an electrode 230 disposed on the insulating layer 220, a semiconductor structure 270 disposed on the electrode 230, a diffusion barrier layer 260 disposed on one surface (e.g., a bottom surface) of the semiconductor structure 270, a metal layer 250 disposed on one surface (e.g., a bottom surface) of the diffusion barrier layer, and a conductive bonding layer 240 disposed between the metal layer 250 and the electrode 230. Accordingly, the above description may be equally applied to a description of components of the thermoelectric element 200A according to another embodiment, except for the following description.

In the thermoelectric element 200A according to another embodiment, the diffusion barrier layer 260 may be disposed on any one of a top surface and a bottom surface of the semiconductor structure 270. For example, in the thermoelectric element 200A according to another embodiment, the diffusion barrier layer 260 may be located at a high temperature side in the thermoelectric element 200A. For example, the diffusion barrier layer 260 may be disposed only on the top surface of the semiconductor structure 270.

In the embodiment, a lower-side temperature (e.g., a second temperature) and an upper-side temperature (e.g., a first temperature) may be different from each other in the thermoelectric element 200A in order for power generation. For example, the first temperature may be higher than the second temperature. That is, only the second diffusion barrier layer 262 may be present in the thermoelectric element 200A.

In the thermoelectric element 200A according to the present embodiment, a sealing member (not shown) may have the same or different contact objects. For example, the sealing member (not shown) may be in contact with at least one of the first electrode 231, the first conductive bonding layer 241, and the first metal layer 251 below the semiconductor structure 270, and may be in contact with at least one of the second electrode 232, the second conductive bonding layer 242, the second metal layer 252, and the second diffusion barrier layer 262 above the semiconductor structure 270.

Accordingly, as the thermoelectric element 200A performs power generation based on a temperature difference, the first and second conductive bonding layers 241 and 242 may move to the semiconductor structure 270 respectively along outer side surfaces of the first and second metal layers 251 and 252. In particular, the movement of the second conductive bonding layer 242 adjacent to the second substrate 212 adjacent to the first temperature, which is higher than the second temperature, may be larger than the movement of the first conductive bonding layer adjacent to the first substrate 211 of a low temperature. Thus, the second diffusion barrier layer 262 is disposed between the semiconductor structure 270 and the second electrode 232 to suppress the phenomenon in which the second conductive bonding layer 242 moves along the outer side surface of the second metal layer 252. Accordingly, a phenomenon in which power generation performance of the thermoelectric element 200A according to the embodiment is degraded may be inhibited. In addition, a phenomenon in which a void is formed in the second conductive bonding layer 242 as the second conductive bonding layer 242 moves to the semiconductor structure 270 may be suppressed. Accordingly, structural reliability of the thermoelectric element 200A may be improved.

Figure 9:
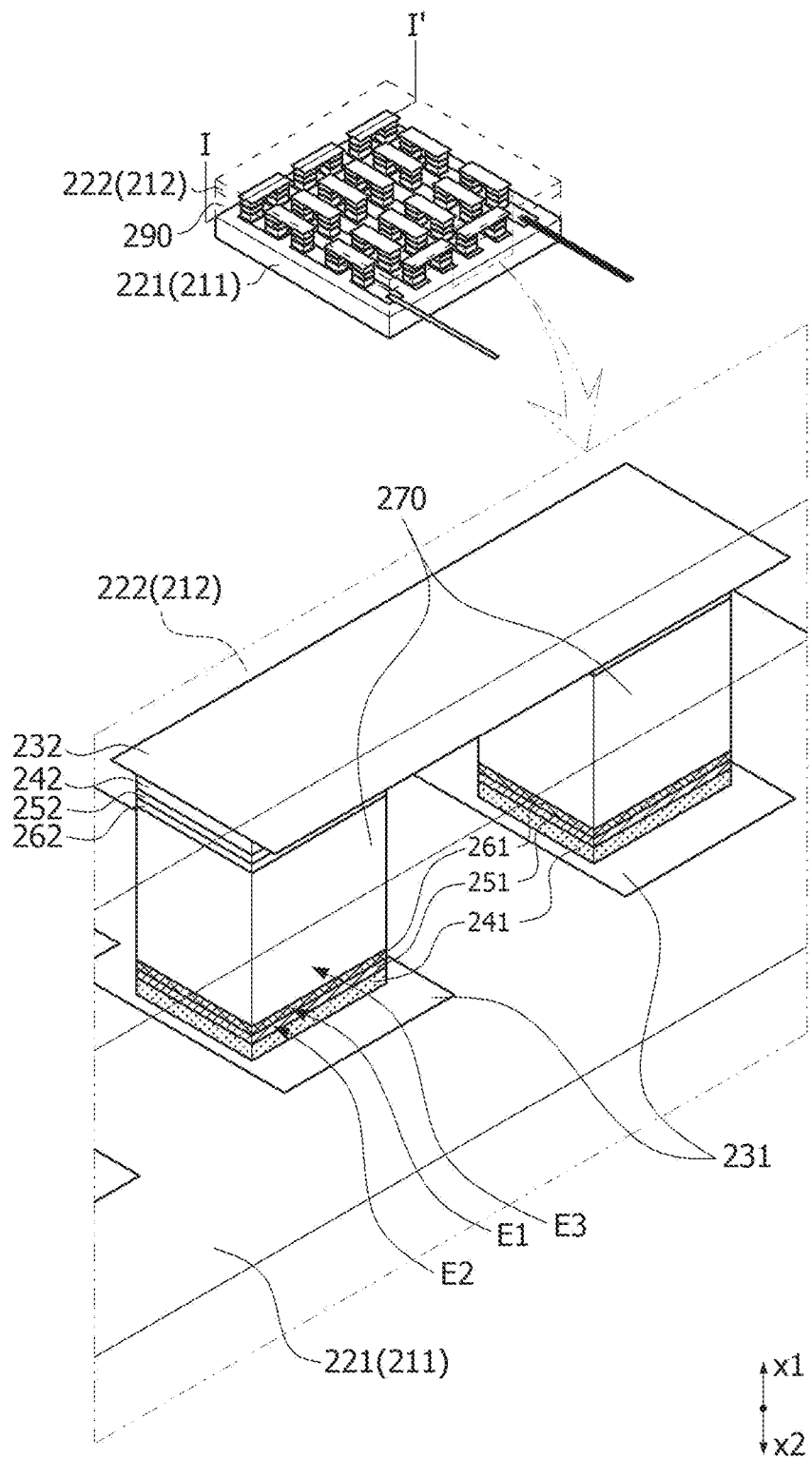
FIG. 9 is a view illustrating first to third outer side surfaces of the thermoelectric element according to the embodiment.
Figure 10:
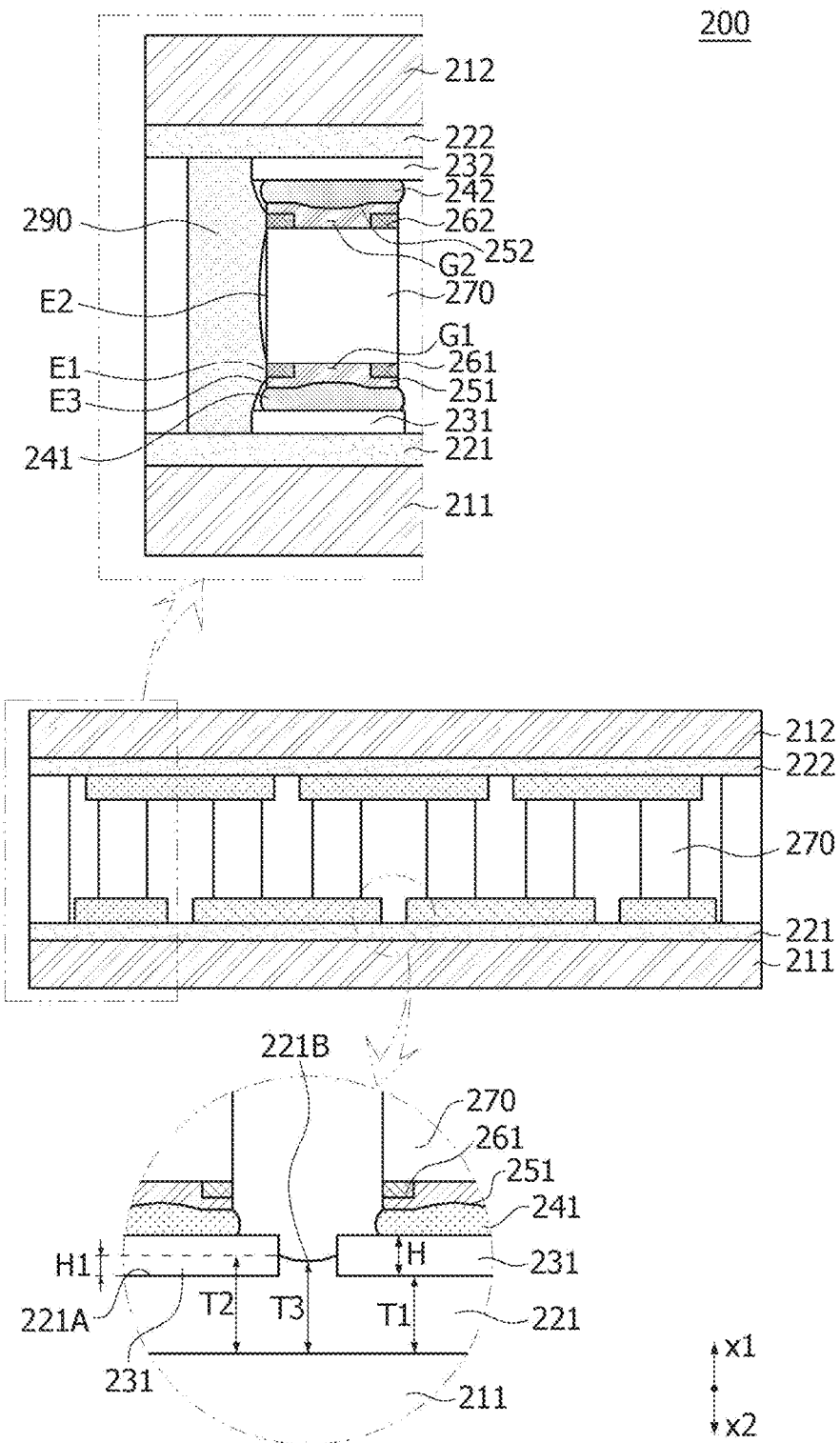
FIG. 10 is a cross-sectional view taken along line I-I' in FIG. 9.

FIG. 9 is a view illustrating first to third outer side surfaces of the thermoelectric element according to the embodiment, and FIG. 10 is a cross-sectional view taken along line I-I' in FIG. 9.

Referring to FIGS. 9 and 10, in the thermoelectric element 200 according to the embodiment, a plurality of electrodes, a plurality of conductive bonding layers, a plurality of metal layers, a plurality of diffusion barrier layers, and a plurality of semiconductor structures may be disposed between the first substrate 211 and the second substrate 212 or between the first insulating layer 221 and the second insulating layer 222.

In addition, as described above, the sealing member 290 may be disposed between the first insulating layer 221 and the second insulating layer 222 along side surfaces of the first insulating layer 221 and the second insulating layer 222. That is, the sealing member 290 may surround the electrode 230, the conductive bonding layer 240, the metal layer 250, the diffusion barrier layer 260, and the semiconductor structure 270. As described above, the description of components will be given based on the first diffusion barrier layer 261, the first metal layer 251, and the first conductive bonding layer 241 below the semiconductor structure 270. The following description of the first diffusion barrier layer 261, the first metal layer 251, and the first conductive bonding layer 241 may be applied to the second diffusion barrier layer 262, the second metal layer 252, and the second conductive bonding layer 242.

In the embodiment, the diffusion barrier layer may include a first outer side surface E1 disposed at the outermost side. For example, the first diffusion barrier layer 261 may include the first outer side surface E1 disposed at the outermost side. The first outer side surface E1 may be disposed closest to the sealing member 290. In other words, the diffusion barrier layer is not disposed in the shortest region between the first outer side surface E1 and the sealing member 290. Alternatively, the first outer side surface E1 may be a surface located at the outermost side on an imaginary line connecting centers (e.g., center of gravity) of a plurality of first diffusion barrier layers 261. This may be equally applied to a second outer side surface E2 and a third outer side surface E3 with respect to the semiconductor structure 270 and the first metal layer 251.

In the embodiment, the sealing member 290 may be in contact with the diffusion barrier layer (e.g., the first diffusion barrier layer) disposed on the outer side. For example, the sealing member 290 may be in contact with the first diffusion barrier layer, and in particular, may be in contact with the first outer side surface E1. Furthermore, the sealing member 290 may be in contact with the first insulating layer 221 and the second insulating layer 222. With this configuration, the sealing member 290 may be in contact with the insulating layer and the diffusion barrier layer. Accordingly, the sealing member 290 may be in contact with the first diffusion barrier layer 261 and the first insulating layer disposed at the outermost side. Accordingly, not only the first diffusion barrier layer 261 but also the sealing member 290 inhibits components of the first conductive bonding layer 241 from moving into the semiconductor structure 270 along the outer side surface of the first diffusion barrier layer 261. Furthermore, moisture can be inhibited from penetrating into the first conductive bonding layer and the first electrode.

In addition, the semiconductor structure 270 may include the second outer side surface E2 disposed at the outermost side. For example, the second outer side surface E2 may be disposed closest to the sealing member 290. Accordingly, the semiconductor structure 270 is not disposed in the shortest region between the second outer side surface E2 and the sealing member 290.

In the embodiment, the second outer side surface E2 and the first outer side surface E1 may be disposed adjacent to each other. Furthermore, when the outer side surfaces of the semiconductor structure 270 and the diffusion barrier layer 260 are coplanar with each other, the first outer side surface E1 and the second outer side surface E2 may be coplanar with each other.

In addition, the metal layer may include the third outer side surface E3 disposed at the outermost side. For example, the first metal layer 251 may have the third outer side surface E3 that is a surface closest to the sealing member 290. The third outer side surface E3 is disposed closest to the sealing member 290 so that the metal layer is not disposed in the shortest region between the third outer side surface E3 and the sealing member 29.

Accordingly, the third outer side surface E3 may be disposed adjacent to the first outer side surface E1 or the second outer side surface E2. In addition, when the outer side surfaces of the semiconductor structure 270, the diffusion barrier layer 260, and the metal layer 250 are coplanar with each other, the first outer side surface E1, the second outer side surface E2, and the third outer side surface E3 may be coplanar with each other.

In addition, some of side surfaces of a plurality of first electrodes 231 may be buried in the first insulating layer 221. In this case, a height H1 of each of the side surfaces of the plurality of first electrodes 231 buried in the first insulating layer 221 may be 0.1 to 1 times, preferably 0.2 to 0.9 times, more preferably 0.3 to 0.8 times a thickness H of each of the plurality of first electrodes 231. As described above, when some of the side surfaces of the plurality of first electrodes 231 are buried in the first insulating layer 221, a contact area between the plurality of first electrodes 231 and the first insulating layer 221 is enlarged, and accordingly, heat transfer performance and bonding strength between the plurality of first electrodes 231 and the first insulating layer 221 may be further increased.

In addition, when the height H1 of each of the side surfaces of the plurality of first electrodes 231 buried in the first insulating layer 221 is less than 0.1 times the thickness H of each of the plurality of first electrodes 231, it may be difficult to obtain sufficient heat transfer performance and bonding strength between the plurality of first electrodes 231 and the first insulating layer 221, and when the height H1 of each of the side surfaces of the plurality of first electrodes 231 buried in the first insulating layer 221 exceeds 1.0 times the thickness H of each of the plurality of first electrodes 231, the first insulating layer 221 may rise over the plurality of first electrodes 231 and thus there is a possibility of an electrical short circuit.

More specifically, the surface or contact surface (top surface) of the first insulating layer 221 facing the first electrode 231 may include a first recess 221A and a second recess 221B, and the first electrode 231 may be disposed in the first recess 221A. The second recess 221B is disposed between the plurality of first electrodes 231, and the thickness of the first insulating layer 221 in the second recess 221B decreases from the side surface of each of the electrodes toward a central region of the second recess 221B, such that a vertex may have a smooth "V" shape, but may be shallower than a depth of the first recess 221A. Accordingly, the first insulating layer 221 between the plurality of first electrodes 231 has a variation in thickness, and a height T2 of a region in direct contact with the side surface of each of the plurality of first electrodes 231 may be the greatest and a height T3 of the central region may be less than the height T2 of the region in direct contact with the side surface of each of the plurality of first electrodes 231. That is, the height T3 of the central region of the first insulating layer 221 between the plurality of first electrodes 231 may be the smallest in the first insulating layer 221 between the plurality of first electrodes 231. In addition, a height T1 of the first insulating layer 221 below the plurality of first electrodes 231 may be less than the height T3 of the central region of the first insulating layer 221 between the plurality of first electrodes 231.

Figure 11:
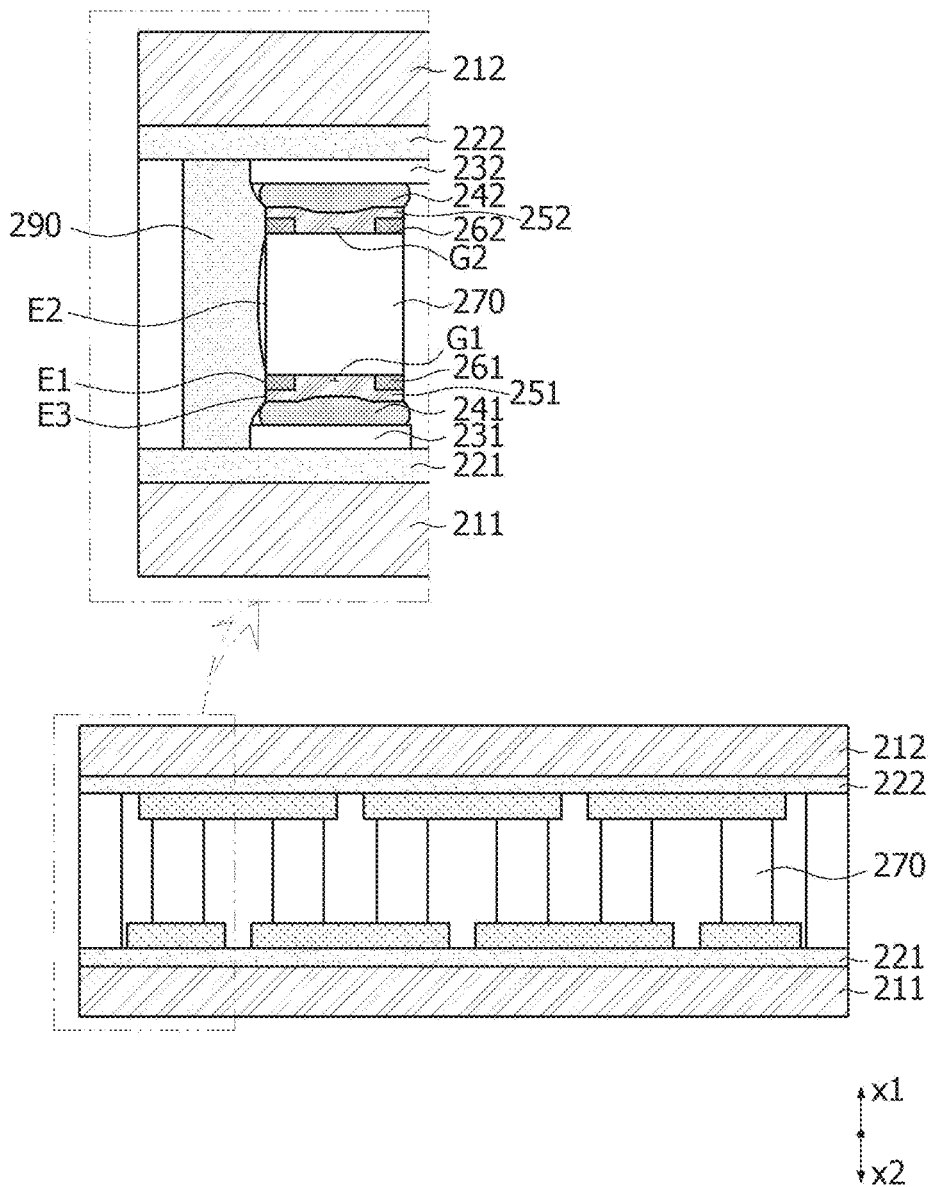
FIG. 11 is a cross-sectional view of a thermoelectric element according to still another embodiment of the present invention.

FIG. 11 is a cross-sectional view of a thermoelectric element according to still another embodiment of the present invention.

Referring to FIG. 11, a thermoelectric element 200B according to still another embodiment may include a first substrate 211, a second substrate 212, a first insulating layer 221, a second insulating layer 222, a first electrode 231, a second electrode 232, a first conductive bonding layer 241, a second conductive bonding layer 242, a first metal layer 251, a second metal layer 252, a first diffusion barrier layer 261, a second diffusion barrier layer 262, and a semiconductor structure 270. Furthermore, the above description may be equally applied to the first substrate 211, the second substrate 212, the first insulating layer 221, the second insulating layer 222, the first electrode 231, the second electrode 232, the first conductive bonding layer 241, the second conductive bonding layer 242, the first metal layer 251, the second metal layer 252, the first diffusion barrier layer 261, the second diffusion barrier layer 262, and the semiconductor structure 270, except for the following description.

In addition, a plurality of electrodes, a plurality of conductive bonding layers, a plurality of metal layers, a plurality of diffusion barrier layers, and a plurality of semiconductor structures disposed between the first substrate 211 and the second substrate 212 or between the first insulating layer 221 and the second insulating layer 222 may be included.

In addition, the diffusion barrier layer may include a first outer side surface E1 disposed at the outermost side. The first outer side surface E1 may be disposed closest to a sealing member 290. In addition, the semiconductor structure 270 may include a second outer side surface E2 disposed at the outermost side. Accordingly, the second outer side surface E2 may be disposed closest to the sealing member 290. In addition, the metal layer may include a third outer side surface E3 disposed at the outermost side. In addition, the third outer side surface E3 may be disposed closest to the sealing member 290.

In the present embodiment, the sealing member 290 may be in contact with the first outer side surface E1 and the third outer side surface E3. Accordingly, by bringing the sealing member 290 into contact with the third outer side surface E3, the metal layer, for example, the first metal layer 251, may be suppressed from moving along the side surface of the first diffusion barrier layer 261. With this configuration, a part of the first conductive bonding layer 241, which is disposed at the outermost side, may be blocked from moving to the side surface of the first metal layer 251. Accordingly, a phenomenon in which a void is generated in the first conductive bonding layer 241 due to movement of the first conductive bonding layer 241 may be suppressed. In addition, moisture penetration into the first conductive bonding layer 241 may also be suppressed. Accordingly, the reliability of the thermoelectric element according to the embodiment may be improved.

Figure 12:
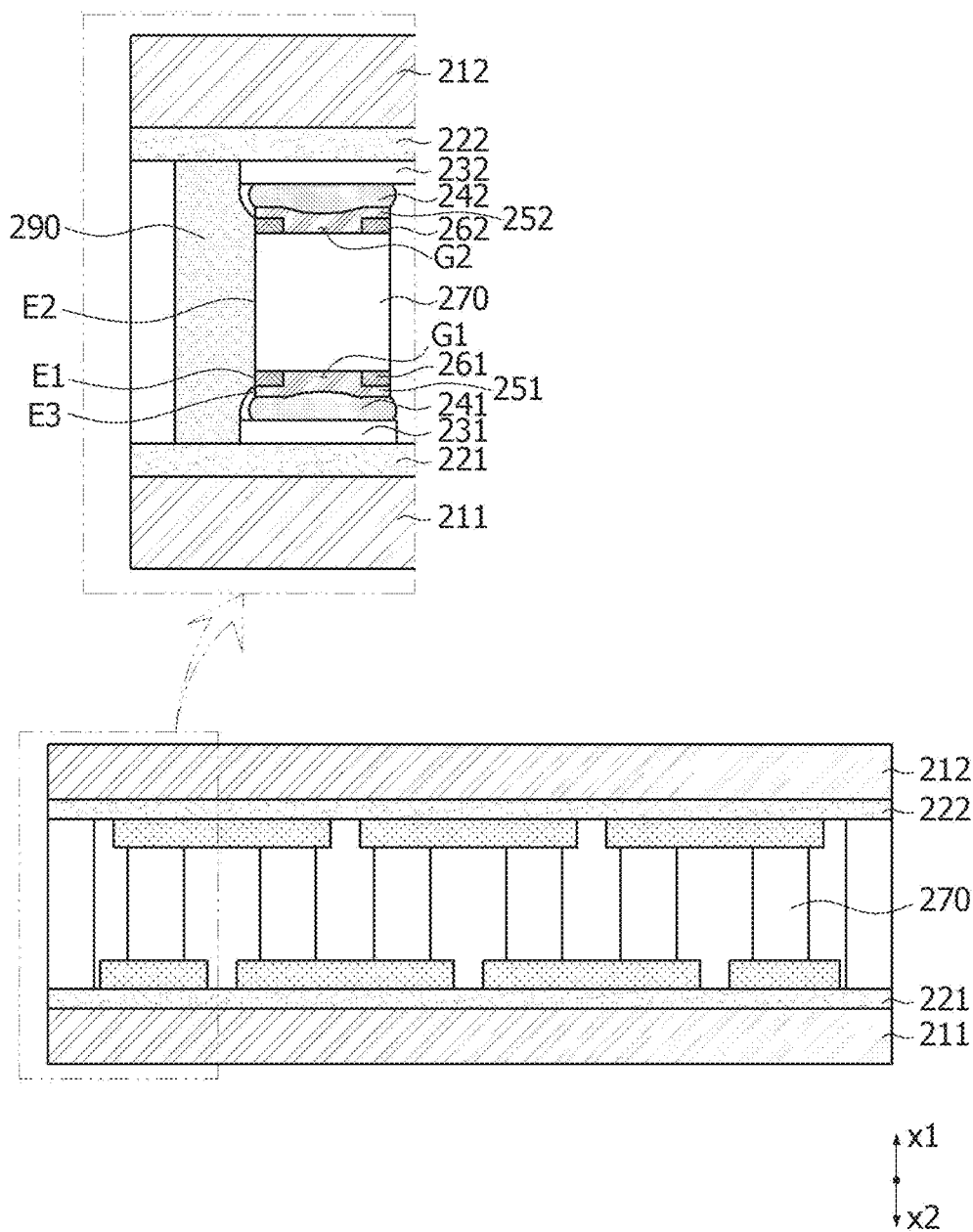
FIG. 12 is a modified example of FIG. 11.

FIG. 12 is a modified example of FIG. 11.

A thermoelectric element 200C according to one modified example may include a first substrate 211, a second substrate 212, a first insulating layer 221, a second insulating layer 222, a first electrode 231, a second electrode 232, a first conductive bonding layer 241, a second conductive bonding layer 242, a first metal layer 251, a second metal layer 252, a first diffusion barrier layer 261, a second diffusion barrier layer 262, and a semiconductor structure 270. Furthermore, the above description may be equally applied to the first substrate 211, the second substrate 212, the first insulating layer 221, the second insulating layer 222, the first electrode 231, the second electrode 232, the first conductive bonding layer 241, the second conductive bonding layer 242, the first metal layer 251, the second metal layer 252, the first diffusion barrier layer 261, the second diffusion barrier layer 262, and the semiconductor structure 270, except for the following description.

In addition, a plurality of electrodes, a plurality of conductive bonding layers, a plurality of metal layers, a plurality of diffusion barrier layers, and a plurality of semiconductor structures disposed between the first substrate 211 and the second substrate 212 or between the first insulating layer 221 and the second insulating layer 222 may be included.

In addition, the diffusion barrier layer may include a first outer side surface E1 disposed at the outermost side. The first outer side surface E1 may be disposed closest to a sealing member 290. In addition, the semiconductor structure 270 may include a second outer side surface E2 disposed at the outermost side. Accordingly, the second outer side surface E2 may be disposed closest to the sealing member 290. In addition, the metal layer may include a third outer side surface E3 disposed at the outermost side. In addition, the third outer side surface E3 may be disposed closest to the sealing member 290.

In the present embodiment, the sealing member 290 may be in contact with the first outer side surface E1 and the second outer side surface E2. Accordingly, by bringing the sealing member 290 into contact with the second outer side surface E3, the metal layer, for example, the first metal layer 251, may be suppressed from moving along the side surface of the first diffusion barrier layer 261 to the semiconductor structure 270.

For example, the sealing member 290 may extend from the first outer side surface E1 to the second outer side surface E2. Accordingly, the sealing member 290 may be in contact with the second outer side surface E2 of the semiconductor structure 270 adjacent to the first outer side surface E1. With this configuration, even when a part of the first conductive bonding layer 241 moves along the side surface of the first metal layer 251, the first diffusion barrier layer 261 may primarily suppress such movement. Furthermore, even when the part of the first conductive bonding layer 241 moves to the first diffusion barrier layer 261, the sealing member 290 may finally inhibit the part of the first conductive bonding layer 241 from moving to the semiconductor structure 270. Thus, the phenomenon in which the first conductive bonding layer 241 moves to the semiconductor structure 270 may be effectively suppressed. Accordingly, the degradation of power generation performance of the thermoelectric element may be suppressed. In addition, a phenomenon in which a void is formed in the first conductive bonding layer 241 as the first conductive bonding layer 241 moves to the semiconductor structure 270 may be suppressed. Accordingly, structural reliability of the thermoelectric element 200 may be improved. In addition, moisture penetration into the semiconductor structure 270 may be suppressed. Accordingly, the reliability of the thermoelectric element according to the embodiment may be improved.

Figure 13:
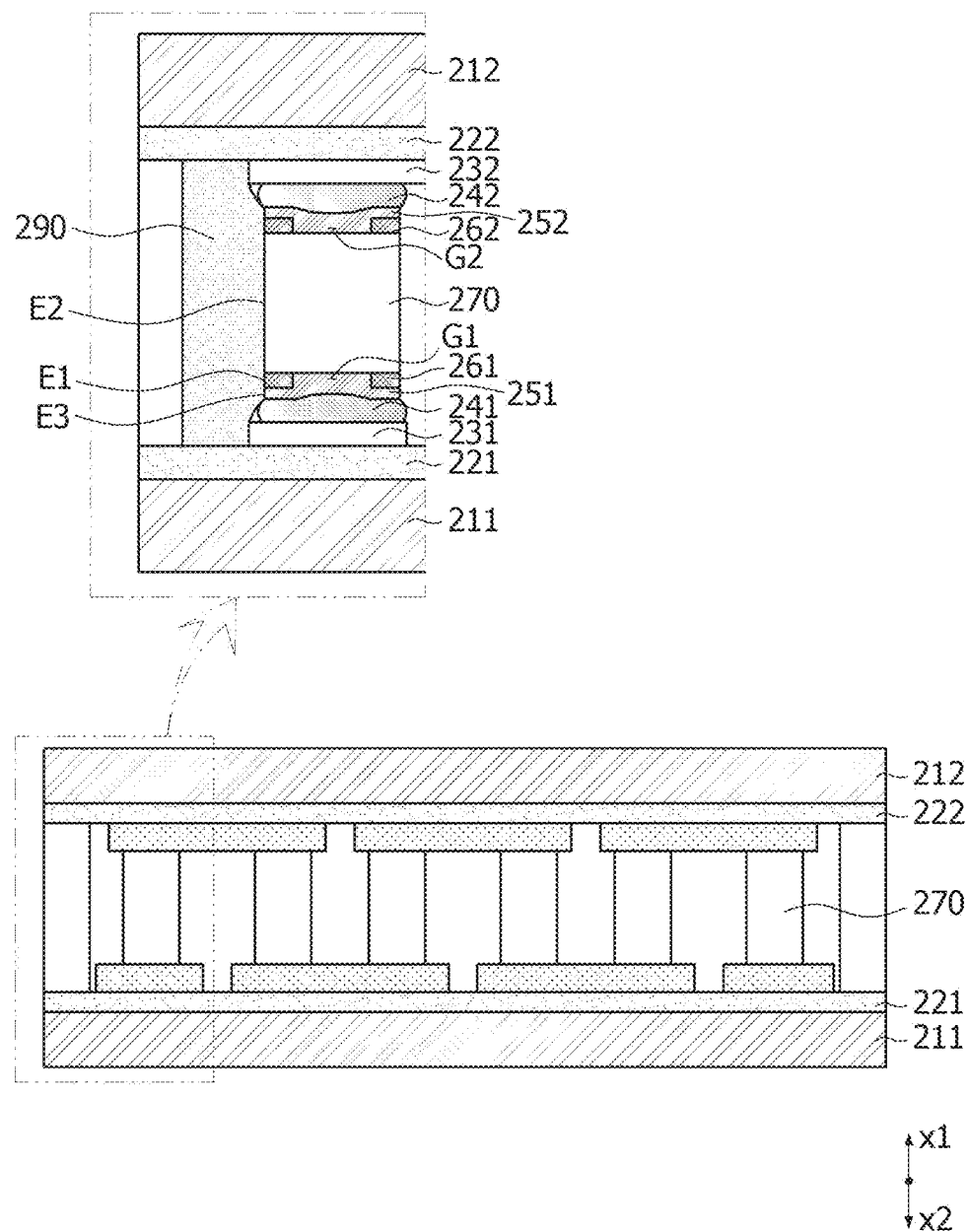
FIG. 13 is another modified example of FIG. 11.

FIG. 13 is another modified example of FIG. 11.

Referring to FIG. 13, a thermoelectric element 200D according to another modified example may include a first substrate 211, a second substrate 212, a first insulating layer 221, a second insulating layer 222, a first electrode 231, a second electrode 232, a first conductive bonding layer 241, a second conductive bonding layer 242, a first metal layer 251, a second metal layer 252, a first diffusion barrier layer 261, a second diffusion barrier layer 262, and a semiconductor structure 270. Furthermore, the above description may be equally applied to the first substrate 211, the second substrate 212, the first insulating layer 221, the second insulating layer 222, the first electrode 231, the second electrode 232, the first conductive bonding layer 241, the second conductive bonding layer 242, the first metal layer 251, the second metal layer 252, the first diffusion barrier layer 261, the second diffusion barrier layer 262, and the semiconductor structure 270, except for the following description.

In addition, a plurality of electrodes, a plurality of conductive bonding layers, a plurality of metal layers, a plurality of diffusion barrier layers, and a plurality of semiconductor structures disposed between the first substrate 211 and the second substrate 212 or between the first insulating layer 221 and the second insulating layer 222 may be included.

In addition, the diffusion barrier layer may include a first outer side surface E1 disposed at the outermost side. The first outer side surface E1 may be disposed closest to a sealing member 290. In addition, the semiconductor structure 270 may include a second outer side surface E2 disposed at the outermost side. Accordingly, the second outer side surface E2 may be disposed closest to the sealing member 290. In addition, the metal layer may include a third outer side surface E3 disposed at the outermost side. In addition, the third outer side surface E3 may be disposed closest to the sealing member 290.

In the present embodiment, the sealing member 290 may be in contact with the first outer side surface E1 and the second outer side surface E2. Accordingly, by bringing the sealing member 290 into contact with the second outer side surface E3, the metal layer, for example, the first metal layer 251, may be suppressed from moving along the side surface of the first diffusion barrier layer 261 to the semiconductor structure 270.

For example, the sealing member 290 may extend from the first outer side surface E1 to the second outer side surface E2 and the third outer side surface E3. Accordingly, the sealing member 290 may be in contact with the second outer side surface E2 of the semiconductor structure 270 and the third outer side surface E3, which are adjacent to the first outer side surface E1. With this configuration, even when a part of the first conductive bonding layer 241 moves along the side surface of the first metal layer 251, the sealing member 290, which is primarily in contact with the second outer side surface E2, may suppress such movement. Furthermore, by bringing the sealing member 290 into contact with the third outer side surface E3 of the semiconductor structure 270, the movement of the first conductive bonding layer 241 to the semiconductor structure 270 may be finally blocked. Thus, the phenomenon in which the first conductive bonding layer 241 moves to the semiconductor structure 270 may be easily suppressed. In addition, the degradation of power generation performance of the thermoelectric element may be suppressed. In addition, a phenomenon in which a void is formed in the first conductive bonding layer 241 as the first conductive bonding layer 241 moves to the semiconductor structure 270 may be suppressed, so that structural reliability of the thermoelectric element 200 may be improved. Furthermore, moisture penetration into the semiconductor structure 270 may also be suppressed. Accordingly, the reliability of the thermoelectric element according to the embodiment may be improved.

The thermoelectric element according to the embodiment of the present invention may be applied to a power generation device and the like. That is, the above description may be equally applied to the power generation device or various electrical devices including the thermoelectric element according to the embodiment. In addition, it should be understood that a plurality of thermoelectric elements or the power generation devices may be arranged to efficiently converge heat sources.

Although the exemplary embodiments of the present invention have been described above, it may be understood by those skilled in the art that a variety of modifications and changes may be made without departing from the concept and scope of the present invention disclosed within the range of the following claims.

The invention claimed is:

1. A thermoelectric element comprising:
an electrode;
a semiconductor structure disposed on the electrode;
a diffusion barrier layer disposed on a bottom surface of the semiconductor structure and having an opening part;
a metal layer disposed on a bottom surface of the diffusion barrier layer; and
a conductive bonding layer disposed between the metal layer and the electrode,
wherein a part of the metal layer extends into the opening part of the diffusion barrier layer to be electrically connected to the semiconductor structure,
wherein the diffusion barrier layer is disposed between the metal layer and the semiconductor structure along an edge of the semiconductor structure,
wherein the metal layer includes a first region overlapping the diffusion barrier layer in a vertical direction and a second region overlapping the opening part of the diffusion barrier layer in the vertical direction, and
wherein the vertical direction is a direction in which the conductive bonding layer and the metal layer are sequentially stacked on the semiconductor structure.

2. The thermoelectric element of claim 1, wherein a thickness of the second region is greater than a thickness of the first region, and
the first region surrounds the second region.

3. The thermoelectric element of claim 1, comprising a sealing member surrounding the electrode, the semiconductor structure, the diffusion barrier layer, and the metal layer.

4. The thermoelectric element of claim 3, comprising:
a substrate disposed below the electrode; and
an insulating layer disposed between the substrate and the electrode,
wherein the sealing member is in contact with the insulating layer.

5. The thermoelectric element of claim 3, wherein the diffusion barrier layer is provided in plural and includes a first outer side surface disposed at an outermost side, and
the sealing member is in contact with the first outer side surface.

6. The thermoelectric element of claim 1, wherein the diffusion barrier layer is made of a metal or an insulating material.

7. The thermoelectric element of claim 4, wherein the substrate includes a first substrate and a second substrate facing each other,
the diffusion barrier layer includes a first diffusion barrier layer disposed between the semiconductor structure and the first substrate and a second diffusion barrier layer disposed between the semiconductor structure and the second substrate, and
an opening part of the first diffusion barrier layer vertically overlaps an opening part of the second diffusion barrier layer.

* * * * *